(12) United States Patent
Hayashi

(10) Patent No.: US 7,692,762 B2
(45) Date of Patent: Apr. 6, 2010

(54) EXPOSURE APPARATUS

(75) Inventor: Tatsuya Hayashi, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 158 days.

(21) Appl. No.: 12/118,797

(22) Filed: May 12, 2008

(65) Prior Publication Data

US 2008/0285713 A1 Nov. 20, 2008

(30) Foreign Application Priority Data

May 17, 2007 (JP) ............................. 2007-131794

(51) Int. Cl.
*G03B 27/52* (2006.01)

(52) U.S. Cl. ...................................... 355/30

(58) Field of Classification Search .................. 355/30, 355/53, 55

See application file for complete search history.

(56) References Cited

U.S. PATENT DOCUMENTS 6,961,114 B2 * 11/2005 Murayama et al. ............ 355/30

FOREIGN PATENT DOCUMENTS

JP 2003-045782 A 2/2003

\* cited by examiner

*Primary Examiner*—Kiet T Nguyen
(74) *Attorney, Agent, or Firm*—Canon U.S.A., Inc. IP Division

(57) ABSTRACT

An EUV exposure apparatus is configured to maintain the reflective index of the optical element as high as possible and to minimize the maintenance frequency of the optical element by restraining attachments of released gas particles by degasifying to the optical element. An exposure apparatus is configured to expose a pattern of an original on a substrate by using extreme ultraviolet light. The exposure apparatus includes an optical element configured to receive the extreme ultraviolet light, a barrel configured to support the optical element, a chamber configured to store the barrel, and a partition wall configured outside and around an optical path of the extreme ultraviolet light in the barrel.

6 Claims, 5 Drawing Sheets

EXPOSURE APPARATUS

BACKGROUND OF THE INVENTION

1. Field of the Invention

The present invention relates to an exposure apparatus that uses extreme ultraviolet ("EUV") light for exposure.

2. Description of the Related Art

The semiconductor manufacturing photolithography has recently promoted use of the exposure light having a shorter wavelength from the i-line and the g-line to the KrF excimer laser and the ArF excimer laser. As the use of the exposure light having a shorter wavelength is promoted, a finer mask pattern can be transferred on to a wafer. However, the lithography using the UV light has limits in principle of exposing a thinner critical dimension ("CD"). Accordingly, the EUV lithography calls attentions, which uses the EUV light having a wavelength of 13 to 20 nm smaller than that of the UV light.

The EUV light typically has a wavelength of 13.5 nm, and can provide a much smaller resolution than the conventional photolithography, but is likely to be absorbed into a material. Therefore, with a conventional dioptric optical system in the atmospheric pressure as in the lithography that uses the UV light for a light source, the EUV light is absorbed into a glass material and a gas in the glass material and only a very small dose can reach the substrate, such as a wafer. Therefore, it is necessary to use a catoptric optical system in a vacuum for the exposure with the EUV light. Japanese Patent Laid-Open No. 2003-45782 discloses a reduction projection exposure apparatus that uses the EUV light for the exposure light.

Degasifying arises from an actuator located in the exposure apparatus or a resist coated substrate when the inside of the EUV exposure apparatus becomes a vacuum environment. Degasifying also arises from an irradiated area on a wafer when the EUV light is irradiated onto the resist applied substrate. A component of released gas by the degasifying contains hydrocarbons, and forms a carbon layer on a surface of an optical element by a photochemical reaction with the EUV light after the hydrocarbon attaches to the surface of the optical element. A component of released gas by the degasifying also contains water, and oxidizes the surface of the optical element after the water attaches to the surface. A carbon layer formed on the optical element surface or the optical element's deteriorated surface due to the oxidation will reduce the reflective index of the optical elements. The reduction in reflective index will lower the exposure apparatus' throughput and will lead to the productivity.

SUMMARY OF THE INVENTION

The present invention is directed to an EUV exposure apparatus configured to maintain the reflective index of the optical element as high as possible and to minimize the maintenance frequency of the optical element by restraining attachments of released gas particles by degasifying to the optical element.

The exposure apparatus as one aspect of the present invention is configured to expose a pattern of an original on a substrate by using extreme ultraviolet light. The exposure apparatus includes an optical element configured to receive the extreme ultraviolet light, a barrel configured to support the optical element, a chamber configured to store the barrel, and a partition wall configured to surround an optical path of the extreme ultraviolet light in the barrel.

Further features of the present invention will become apparent from the following description of exemplary embodiments (with reference to the attached drawings).

BRIEF DESCRIPTION OF THE DRAWINGS

FIG. 1 shows an exposure apparatus according to a first embodiment of the present invention configured to use the EUV light (which is herein referred to as light having a wavelength of 0.1 to 30 nm-wavelength, preferably, 10 to 15 nm).

DESCRIPTION OF THE EMBODIMENTS

Figure 1:
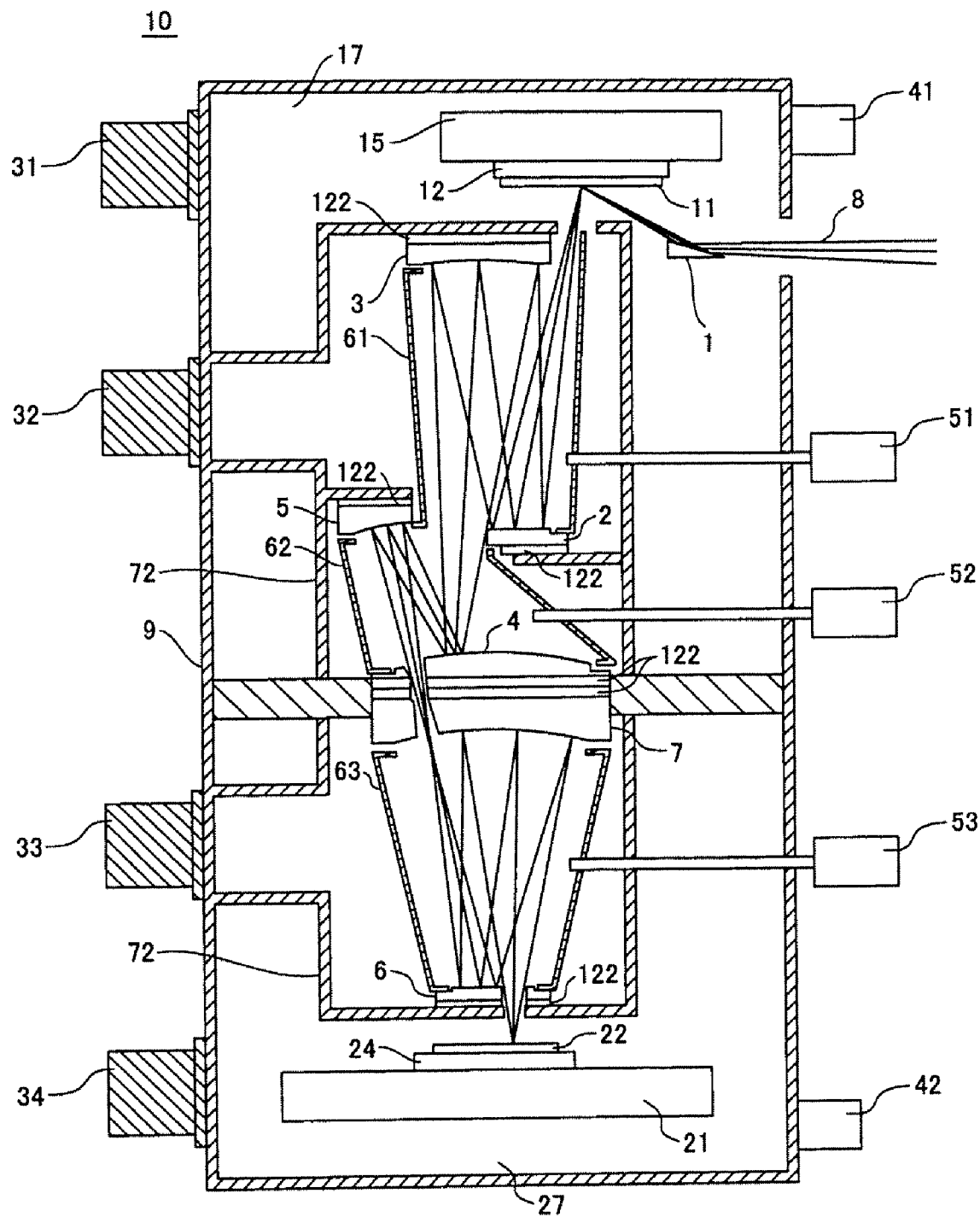
FIG. 1 is a schematic sectional view that shows a configuration of an EUV exposure apparatus according to a first embodiment of the present invention.

As shown in FIG. 1, 8 represents EUV light emitted from a EUV light source (not shown) and introduced to an illumination optical system (not shown). An original illumination mirror 1 irradiates the EUV light 8 onto an original 11. 2 to 7 represent multilayer mirrors in projection optical systems. 2 is a first mirror, 3 is a second mirror, 4 is a third mirror, 5 is a fourth mirror, 6 is a fifth mirror, and 7 is a sixth mirror respectively. Each of the mirrors 2 to 7 is supported by a barrel 72. 11 represents an original, 12 is an original holder, 15 is an original stage, 17 is an original stage space that encloses the original stage 15, 22 is a wafer, 24 is a wafer holder, 21 is a wafer stage, 27 is a wafer stage space that encloses the wafer stage 21, respectively.

There are several EUV light sources not shown in the figure. A laser produced plasma light source is one of them and can emit the luminous fluxes of only a necessary wavelength band by selecting a target material. For example, the EUV light having a wavelength of 13 to 14 nm will be emitted from the plasma by irradiating a pulsed laser beam onto a target material, Xe, supplied from a pulsed nozzle.

An illumination optical system (not shown) is comprised of a plurality of multilayer mirrors and an optical integrator. The illumination optical system serves to effectively condense the light emitted from a light source and to make uniform the illuminance over the exposed area. The optical integrators serve to illuminate a mask uniformly by a predetermined numerical aperture ("NA").

Each of the mirrors 2 to 7 in the projection optical system is a multilayer mirror alternately coated with Mo and Si. The multilayer mirror receives the EUV light emitted from the illumination optical system. Most of the energy absorbed in the multilayer mirrors is converted into the heat since this multilayer film has a reflective index of approximately 67% to the normal incidence of the EUV light. Accordingly, the mirror's substrate material uses a low thermal expansion glass.

Both the original stage 15 and the wafer stage 21 provide a mechanism that drives in a vacuum environment and can be scanned in synchronization with a velocity ratio proportional to a reduction ratio. Positions and orientations of the original stage 15 and the wafer stage 21 are controlled and observed by laser interferometers (not shown).

The original 11 is held by the original holder 12 on the original stage 15. The wafer 22 is held by the wafer holder 24 on the wafer stage 21. The original stage 15 and the wafer stage 21 have a fine movement mechanism for positioning of the original 11 and the wafer 22 respectively.

Once exposure ends, the wafer stage 21 steps in X and Y directions to the next scan exposure starting point to resume exposure.

Each of the mirrors 2 to 7 shown in FIG. 1 is provided with a driving part 122 that controls its orientation. It is well known that degasifying arises when the driving part 122, sensors, or cables (not shown) are exposed to a vacuum environment. Therefore, the driving part 122 in the present invention can be provided outside a space enclosed by partition walls 61 to 63, which will be described later.

It is also well known that degasifying arises by a photochemical reaction with a resist applied onto a wafer 22, due to irradiation of the EUV light 8 on the wafer 22 (on the substrate).

A component of released gas by the degasifying from the resist, the driving part 122, sensors (not shown), or cables mainly contains water and hydrocarbon. The water oxidizes the mirror surface, and the hydrocarbon forms a carbon layer on the surfaces of the mirrors 2 to 7. Both of them can deteriorate optical characteristics of the mirrors 2 to 7. In order to maintain the reflective index of each of the mirrors 2 to 7, it is necessary to prevent released gas particles by the degasifying in the exposure apparatus 10, from reaching the mirrors 2 to 7.

This embodiment attempts to protect the mirrors 2 to 7 from the degasifying arising in the exposure apparatus, and thus provides the partition walls 61 to 63 in the barrel 72. The partition walls 61 to 63 can be configured so that a member causing the degasifying, such as the driving part 122 and the sensors (not shown), can be kept from the spaces enclosed by the partition walls 61 to 63 and the mirrors 2 to 7. This configuration will restrain inflow of the released gas in the space that includes the reflecting surfaces of the mirrors 2 to 7 and the optical path of the EUV light 8, and protect the mirrors 2 to 7 from any contaminations generated due to the degasifying.

The partition walls 61 to 63 can be arranged to keep the exposure light (the EUV light 8) unobstructed and to avoid their contacts with the mirrors 2 to 7. The non-contact arrangement of the partition walls 61-63 with the mirrors 2-7 will ensure certain a degree of freedom of the mirrors 2 to 7.

Moreover, supply units 51 to 53 are provided to deliver inert gases into the partition walls 61 to 63 and to protect the mirrors 2 to 7 from the degasifying. The internal pressure of each of the partition walls 61 to 63 that is supplied with the inert gas is maintained higher than its external pressure because the outside of the partition walls 61 to 63 is evacuated by exhausting units 31 to 34 that exhaust gases in the chambers. Inflow of the release gas to the inside of each of the partition walls 61 to 63 can be restrained by controlling a difference between the internal and external pressures of the partition walls 61 to 63, or by controlling a flow of the inert gas from apertures in the partition walls 61 to 63 that communicate with the inside of the chamber. The inside of each of the partition walls 61 to 63 is filled with a highly pure inert gas. The inert gas reduces its degasifying density and minimizes attachments of the release gas particles to the mirrors 2 to 7. The inert gas delivered into the partition walls 61 to 63 can be helium or argon which exhibits a high transmittance to the EUV light 8.

The internal pressure of the exposure apparatus 10 is controlled by barometers 41 and 42. The inert gas supply units 51 to 53 control the inert gas flow to maintain the internal pressure of the exposure apparatus 10 at a constant level. The supply units include a unit that will automatically stop delivering the inert gas, if the internal pressure of exposure apparatus 10 exceeds the prescribed level due to any unpredictable problem.

The interior of the exposure apparatus is spatially separated by the chamber wall 9, the barrel 72, and the partition walls 61 to 63, and the degree of vacuum and partial pressure of the released gas by the degasifying in each space can be individually controlled. In the apparatus, the chamber wall 9 stores the barrel 72, and the barrel 72 accommodates the partition walls 61 to 63. The inert gas supply amount can be saved by individually controlling the inert gas supply amount in each space based on the degree of vacuum and partial pressure of the gas in each space.

The partition walls 61 to 63 in the exposure apparatus 10 will reduce the spatial volume to supply the inert gas and to save the inert gas supply amount.

Figure 2:
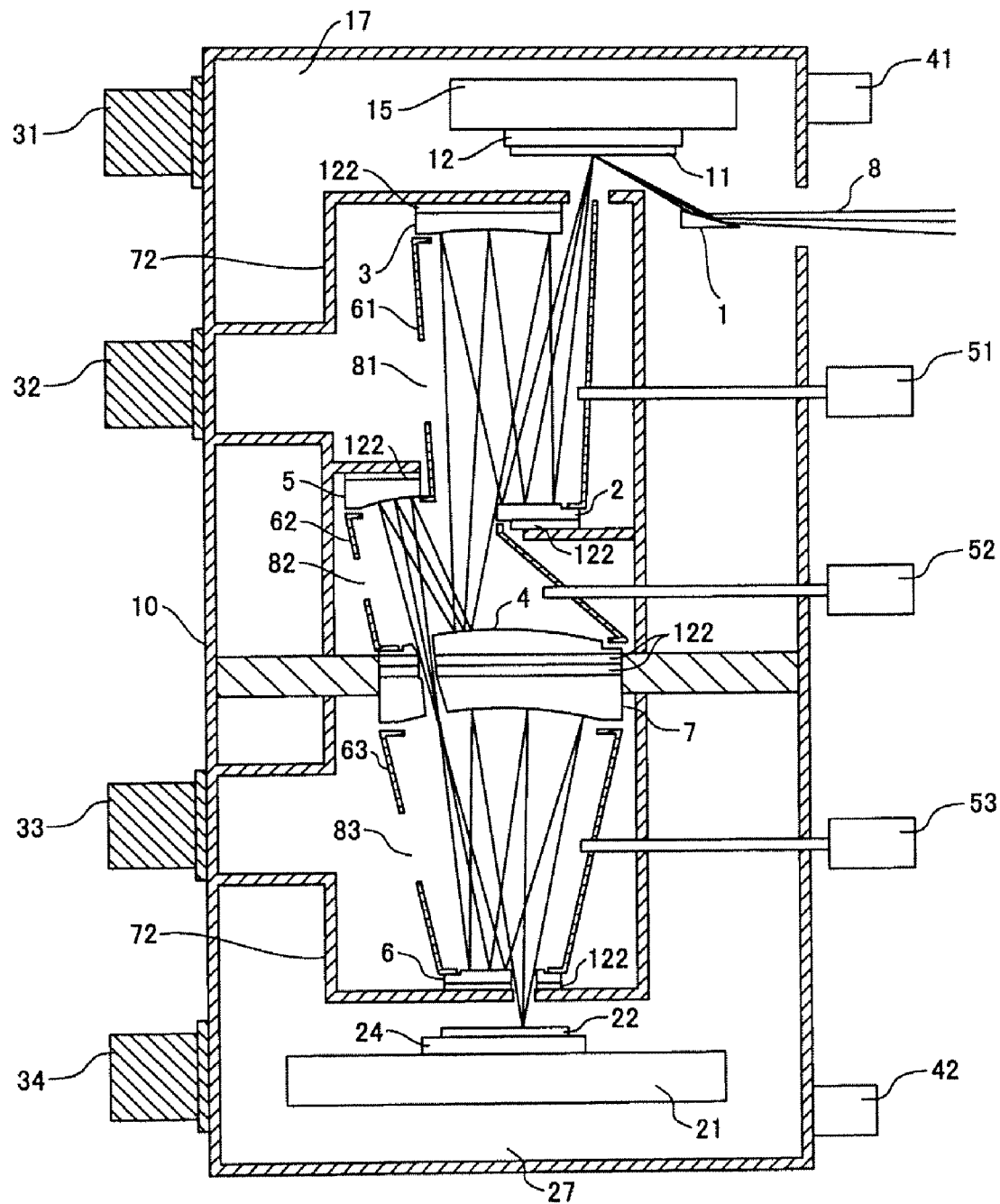
FIG. 2 is a schematic sectional view that shows a configuration of the EUV exposure apparatus according to a second embodiment of the present invention.

FIG. 2 is a schematic view of the EUV exposure apparatus according to a second embodiment. Those elements in FIG. 2, which are the corresponding elements in FIG. 1, will be designated by the same reference numerals and a description thereof will be omitted. This embodiment is similar to the first embodiment, and will discuss only a difference from the first embodiment.

The partition walls 61 to 63 in the barrel 72 have apertures that allow passages of the EUV light 8. The apertures of the partition walls 61 to 63 can be adjacent to the mirrors 2 to 7 to prevent inflows of the released gas into the partition walls through the apertures. However, it is conceivable that the gas may flow in the partition walls even through a very small space due to the diffusion.

This embodiment provides an EUV exposure apparatus that can reduce the degasifying density in each of the partition walls 61 to 63 even when the released gas by the degasifying flows into each of the partition walls 61 to 63 due to the diffusion.

In order to reduce the degasifying density of the gas flowing into the partition wall due to the diffusion, it is effective to replace the atmospheres in the partition walls 61 to 63 with highly pure inert gas. The atmospheres in the partition walls 61 to 63 can be promptly replaced by promptly effusing the inert gas delivered to the inside of the partition walls 61 to 63 to the outside. While the first embodiment utilizes the aperture that allows a passage of the EUV light 8 as an aperture that allows escapes of the inert gas from the partition walls 61 to 63, this embodiment adds at least one aperture. The partition walls 61 to 63 are placed adjacent to the mirrors 2 to 7, and the apertures which the partition walls 61 to 63 can pass through are almost blocked by the mirrors 2 to 7. Therefore, a channel that connects the inside of each of the partition walls 61 to 63 to barrel 72 is narrow, and the inert gas is less likely to flow out of the partition walls 61 to 63. Apertures 81 to 83 that connect the interior and the exterior of partition wall 61 to 63 to each other facilitate escapes of the inert gas form partition walls 61 to 63, in addition to the aperture that allow a passage of the EUV light 8. The apertures 81 to 83, through which the EUV light 8 does not pass, can be located at part unadjacent to the driving part 122 or to the sensor (not shown). The inert gas containing the gas released by the degasifying from the partition walls 61 to 63, is evacuated from the exposure apparatus 10 by exhausting units 32 and 33 that are configured to exhaust the barrel 72. This embodiment can reduce the degasifying density in the partition walls 61 to 63, even when the released gas by the degasifying flows into the partition walls 61 to 63 due to the diffusion, and minimizes attachments of the released gas particles to the mirrors 2 to 7 in the projection optical system.

Figure 3:
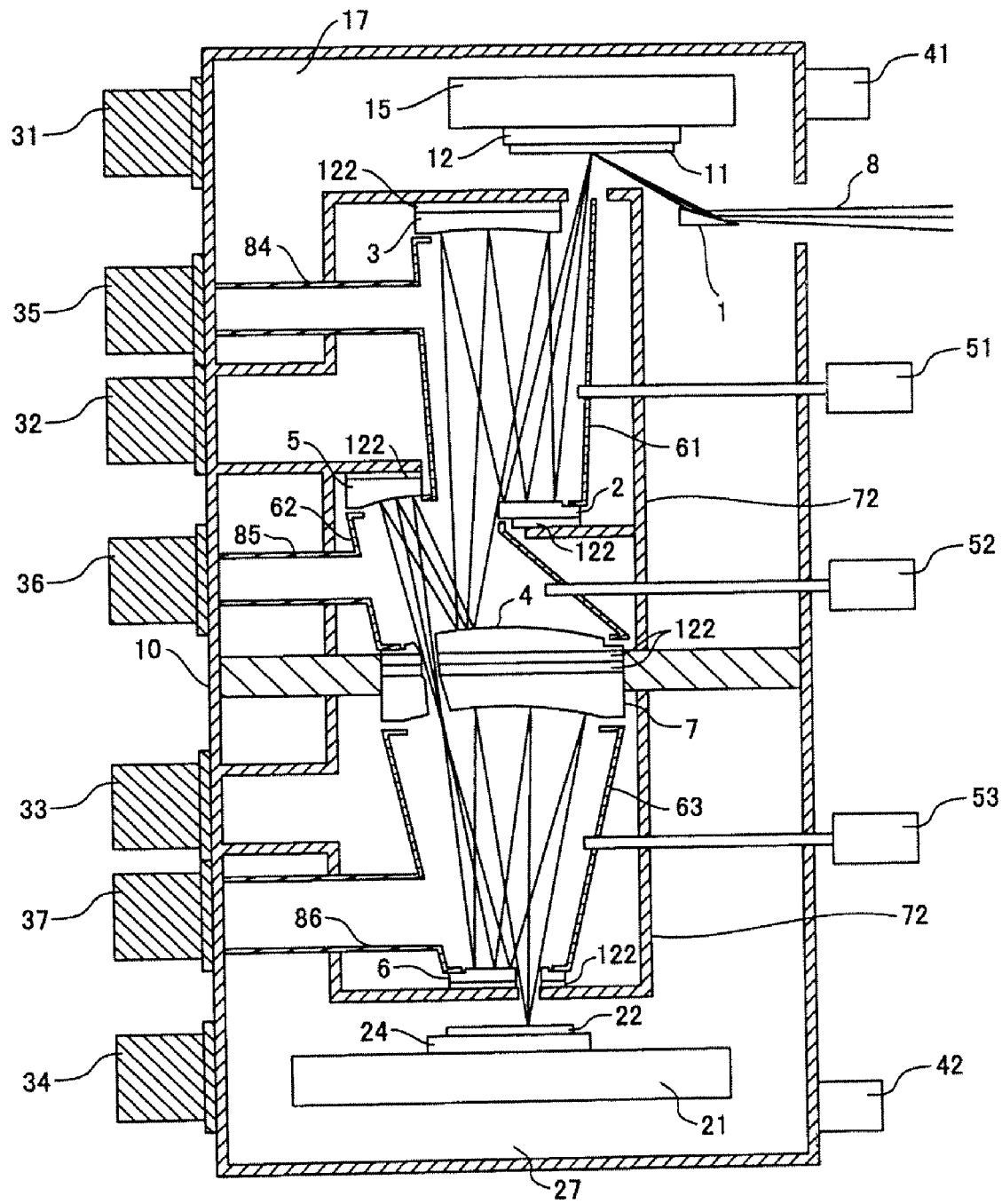
FIG. 3 is a schematic sectional view that shows a configuration of the EUV exposure apparatus according to a third embodiment of the present invention.

FIG. 3 is a schematic view of the EUV exposure apparatus according to a third embodiment. This embodiment is similar to the first embodiment, and will discuss only a difference from the first embodiment.

The partition walls 61 to 63 in the barrel 72 include exhausting ducts 84 to 86. The exhausting ducts 84 to 86 spatially connect internal spaces of the partition walls 61 to 63 to inlets of exhausting units 35 to 37, and evacuate the inert gas delivered into partition walls 61 to 63 from the exposure apparatus 10. This embodiment is effective where there are the driving part 122 and the sensor (not shown) adjacent to the apertures 81 to 83, through which the EUV light 8 does not pass, shown in the second embodiment, and the degasifying arises from there, and the released gas flows into the partition wall 61 to 63 due to the diffusion. The degasifying density in the partition walls 61 to 63 will be reduced when the atmospheres in the partition walls will be replaced with highly purified inert gases. An oscillation insulating part (not shown) is configured at connecting parts of the exhausting ducts 84 to 86 and the exhausting units 35 to 37 in order to reduce any influence on the mirrors 2 to 7 of oscillations of exhausting units 35 to 37.

Figure 4:
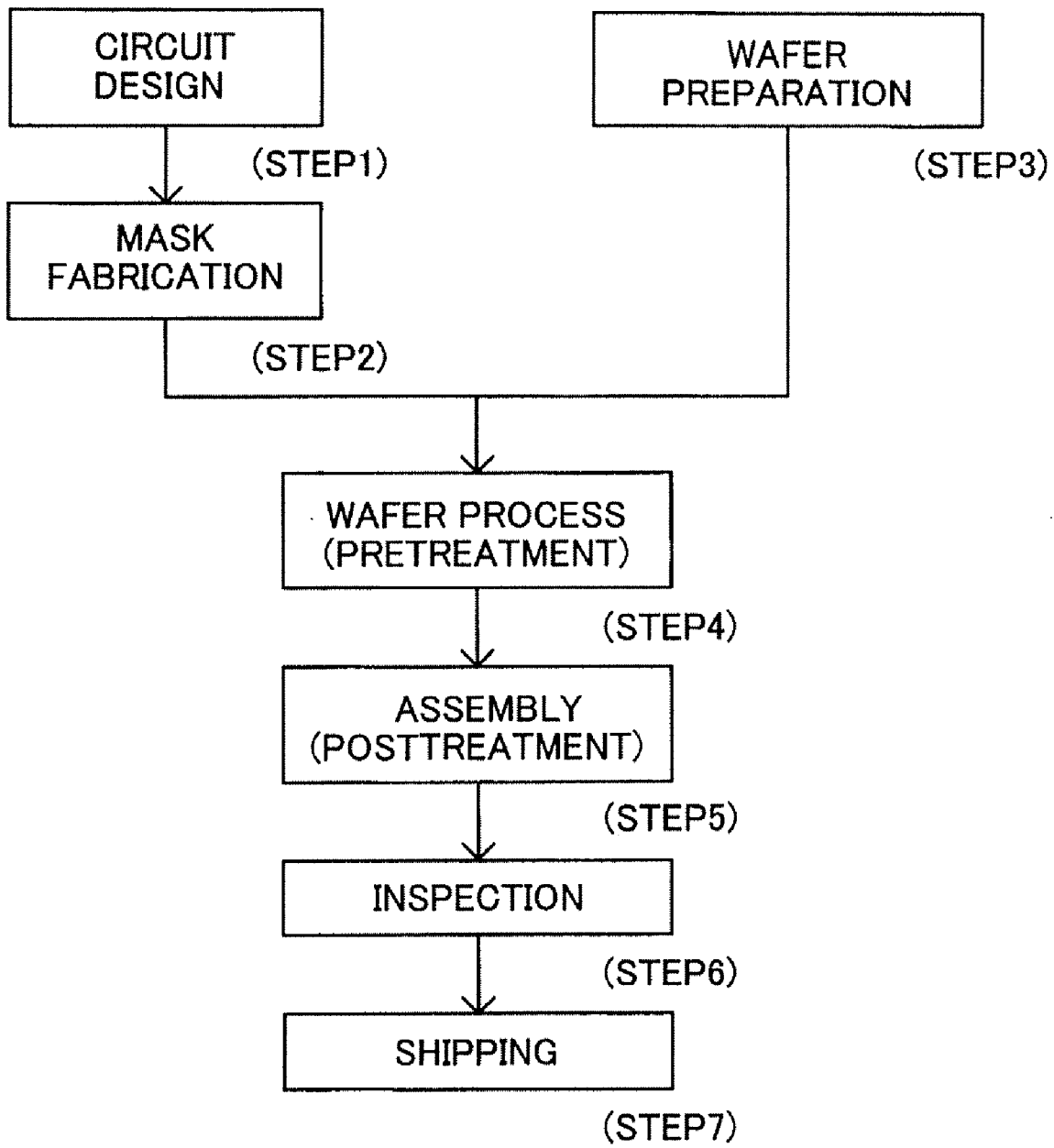
FIG. 4 is a flowchart for explaining a manufacturing method of the device using the exposure apparatus shown in FIG. 1 and FIG. 3.

Here, a description will be given of the fabrication of a semiconductor device as an example of device manufacturing process using the exposure apparatus 10 as discussed above. FIG. 4 represents a flowchart for explaining an overall manufacturing process of how to fabricate semiconductor devices. Step 1 (circuit design) designs a semiconductor device circuit. Step 2 (mask fabrication) forms a mask having a designed circuit pattern. Step 3 (wafer preparation) manufactures a wafer using materials such as silicon. Step 4 (wafer process), which is also referred to as a pretreatment, forms the actual circuitry on the wafer through lithography using the mask and wafer. Step 5 (assembly), which is also referred to as a post-treatment, forms into a semiconductor chip using the wafer formed in Step 4 and includes an assembly step (e.g., dicing, bonding), a packaging step (chip sealing), and the like. Step 6 (inspection) performs various tests on the semiconductor device made in Step 5, such as a validity test and a durability test. Through these steps, a semiconductor device is finished and shipped (Step 7).

Figure 5:
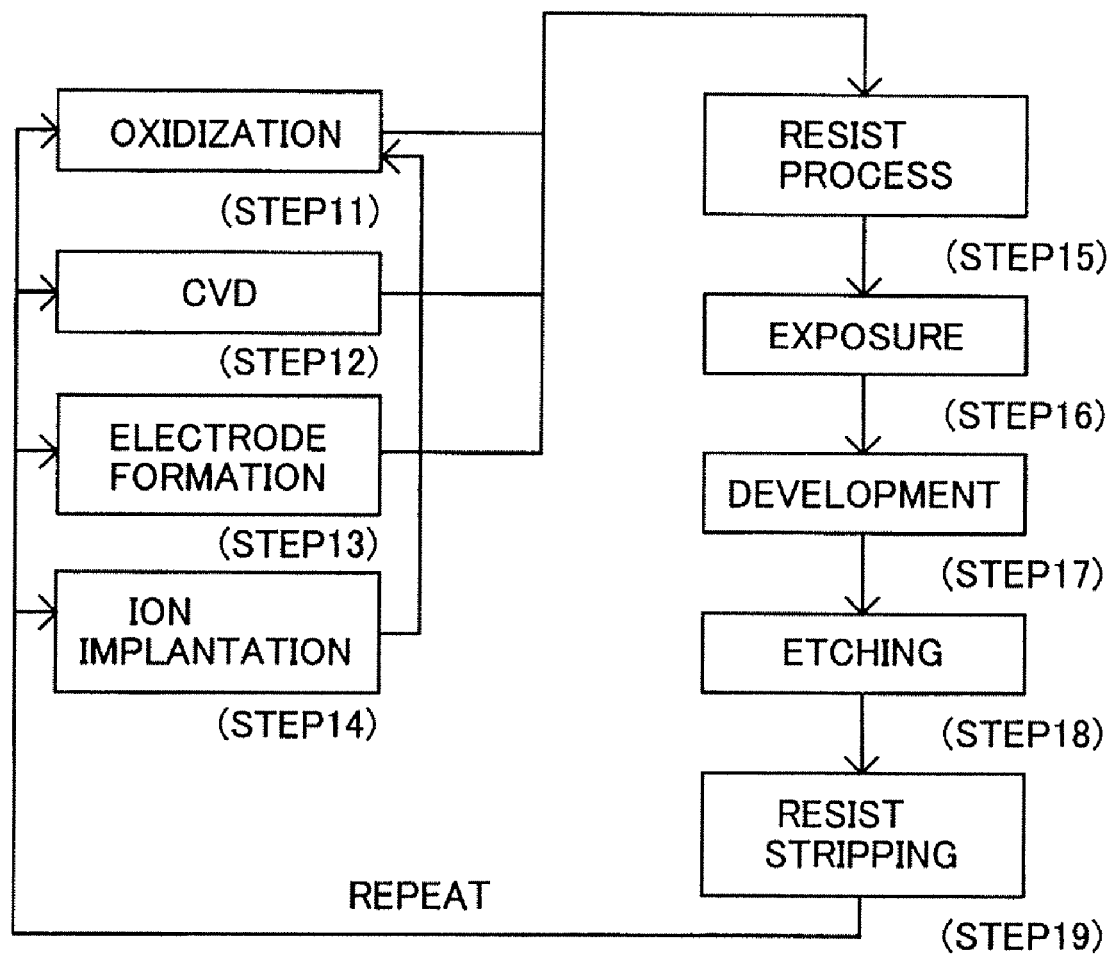
FIG. 5 is a flowchart for explaining further details of STEP 4 shown in FIG. 4.

FIG. 5 is a detailed flowchart of the wafer process as described above. Step 11 (oxidation) oxidizes the wafer's surface. Step 12 (CVD) forms an insulating layer on the wafer's surface. Step 13 (electrode formation) forms electrodes on the wafer by vapor disposition. Step 14 (ion implantation) implants ions into the wafer. Step 15 (resist process) applies a photosensitive material onto the wafer. Step 16 (exposure) uses the above exposure apparatus to project an image of the circuit pattern onto the wafer. Step 17 (development) develops the exposed wafer. Step 18 (etching) etches parts other than a developed resist image. Step 19 (resist stripping) removes unused resist after etching. These steps are repeated to form multilayer circuit patterns on the wafer.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-131794, filled on May 17, 2007, which is hereby incorporated by reference herein its entirety.

What is claimed is:

1. An exposure apparatus configured to expose a pattern of an original on a substrate by irradiating extreme ultraviolet light to the substrate, wherein the exposure apparatus comprises:
    an optical element configured to guide the extreme ultraviolet light to the substrate;
    a barrel configured to support the optical element;
    a chamber configured to store the barrel; and
    a partition wall configured surround an optical path of the extreme ultraviolet light in the barrel.

2. An exposure apparatus according to claim 1, wherein the partition wall is configured in noncontact with the optical element.

3. An exposure apparatus according to claim 1, wherein the exposure apparatus further comprises:
    an exhausting unit configured to exhaust a gas in the chamber; and
    a supply unit configured to deliver an inert gas into a space enclosed by the partition wall.

4. An exposure apparatus according to claim 1, wherein the exposure apparatus further comprises an aperture that communicates with an interior of the chamber.

5. An exposure apparatus according to claim 1, wherein the exposure apparatus further comprises an exhausting unit configured to exhaust a gas in a space enclosed by the partition wall.

6. An exposure apparatus according to claim 1, wherein the exposure apparatus further comprises an actuator configured to drive the optical element, the actuator being located outside a space enclosed by the partition wall.

* * * * *